United States Patent
Huang et al.

(10) Patent No.: US 12,168,834 B2
(45) Date of Patent: Dec. 17, 2024

(54) SURFACE-TREATED COPPER FOIL AND COPPER CLAD LAMINATE

(71) Applicant: CHANG CHUN PETROCHEMICAL CO., LTD., Taipei (TW)

(72) Inventors: Jian-Ming Huang, Taipei (TW); Yao-Sheng Lai, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 399 days.

(21) Appl. No.: 17/560,283

(22) Filed: Dec. 23, 2021

(65) Prior Publication Data

US 2023/0144190 A1 May 11, 2023

(30) Foreign Application Priority Data

Nov. 5, 2021 (TW) .................................. 110141342

(51) Int. Cl.
*C25D 1/00* (2006.01)
*C25D 1/04* (2006.01)
*H05K 1/02* (2006.01)
*H05K 3/02* (2006.01)

(52) U.S. Cl.
CPC .............. *C25D 1/04* (2013.01); *H05K 1/0298* (2013.01); *H05K 3/022* (2013.01)

(58) Field of Classification Search
CPC ......... C25D 1/04; H05K 1/0298; H05K 3/022
See application file for complete search history.

(56) References Cited

U.S. PATENT DOCUMENTS

2020/0106102 A1* 4/2020 Huang .................. H01M 4/131

FOREIGN PATENT DOCUMENTS

| JP | 2014-139336 A | 7/2014 |
|---|---|---|
| JP | 2017-36495 A | 2/2017 |
| JP | 6353193 B2 | 7/2018 |
| JP | 6360659 B2 | 7/2018 |
| JP | 2020-143364 A | 9/2020 |
| KR | 10-2004-0037241 A | 5/2004 |
| KR | 10-0899588 B1 | 5/2009 |
| KR | 10-2020-0096428 A | 8/2020 |
| TW | I575120 B | 3/2017 |
| TW | I624197 B | 5/2018 |

\* cited by examiner

*Primary Examiner* — Zulmariam Mendez
(74) *Attorney, Agent, or Firm* — Winston Hsu

(57) ABSTRACT

A surface-treated copper foil includes a bulk copper foil and a first surface treatment layer. The first surface treatment layer is disposed on a first surface of the bulk copper foil and includes a roughening layer, where the outermost surface of the first surface treatment layer is a treating surface of the surface-treated copper foil. The material volume (Vm) of the treating surface is 0.06 to 1.45 $\mu m^3/\mu m^2$, and the five-point peak height (S5p) of the treating surface is 0.15 to 2.00 μm.

9 Claims, 5 Drawing Sheets

SURFACE-TREATED COPPER FOIL AND COPPER CLAD LAMINATE

BACKGROUND OF THE INVENTION

1. Field of the Invention

The present disclosure relates to the field of copper foils, in particular to a surface-treated copper foil and a copper-clad laminate thereof.

2. Description of the Prior Art

With increasing demand for small-sized and thin electronic products capable of transmitting high-frequency signals, the demand for copper foils and copper-clad laminates is also increasing. Generally, the conductive circuit of the copper-clad laminate is composed of copper wires. Because the conductive circuit has a specific layout design, it may transmit electrical signals to a predetermined area along a predetermined path. In addition, with the continuous miniaturization of the line width/line space of the conductive lines, the thickness of the copper foil of the copper-clad laminate is usually thinned, and the surface of the copper foil is flattened (especially the surface of the copper foil facing the board), so that the conductive lines having the fine line width/line space may be successfully fabricated by etching the copper foil without over etching, under etching or uneven etching.

However, there are still many technical drawbacks to be overcome for the copper-clad laminate having the conductive lines. For example, when the surface of the conductive lines are too flat, the adhesion strength between the conductive lines and the board is reduced, and thus the conductive lines in the copper-clad laminate are easily peeled off from the surface of the board, which causes the failure of transmitting the electrical signal to the predetermined area along the predetermined path. In addition, due to the continuous miniaturization of the line width/line pitch of the conductive lines, the patterns of the conductive lines obtained by etching the copper foil often differ from the corresponding patterned photoresist patterns even though the surface of the copper foil has been flattened.

Therefore, there is still a need to provide a surface-treated copper foil and copper-clad laminate to solve the drawbacks in the prior art.

SUMMARY OF THE INVENTION

In view of the above, the present disclosure provides an improved surface-treated copper foil and copper-clad laminate, which solves the drawbacks existing in the prior art.

According to some embodiments of the present disclosure, a surface-treated copper foil is provided and includes a bulk copper foil and a first surface treatment layer. The first surface treatment layer is disposed on the first surface of the bulk copper foil and includes a roughening layer, where the outermost surface of the first surface treatment layer is a treating surface of the surface-treated copper foil, the material volume (Vm) of the treating surface is in a range of 0.06 to 1.45 $\mu m^3/\mu m^2$, and the five-point peak height (S5p) of the treating surface is in a range of 0.15 to 2.00 $\mu m$.

According to other embodiments of the present disclosure, a copper-clad laminate is provided and includes a board and the aforementioned surface-treated copper foil, in which the treating surface of the surface-treated copper foil is attached to the board.

According to the aforementioned embodiments, when the surface-treated copper foil includes the bulk copper foil and the first surface treatment layer, the material volume (Vm) of the treating surface of the surface-treated copper foil is in a range of 0.06 to 1.45 $\mu m^3/\mu m^2$, and the five-point peak height (S5p) of the treating surface is in a range of 0.15 to 2.00 $\mu m$, the adhesion strength between the conductive lines and the board is improved, and the conductive lines having the fine line width/line space could be successfully fabricated by etching the copper foil. Therefore, the requirements by the industry for the surface-treated copper foil and the copper-clad laminates can be met.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
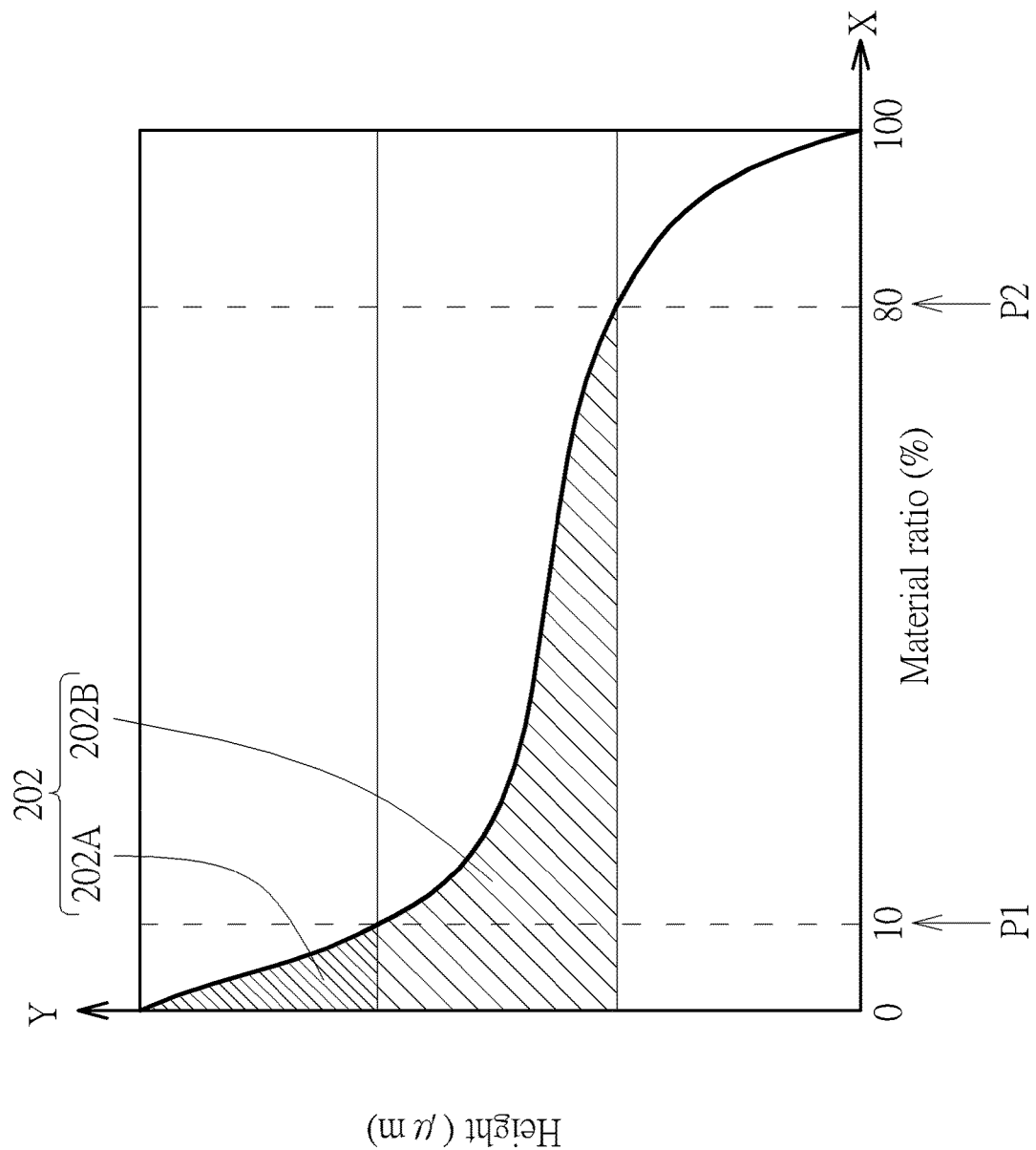
FIG. 1 is a plot showing the relationship between the surface height of the surface-treated copper foil and the material ratio (mr) of the surface-treated copper foil according to one embodiment of the present disclosure.

To provide a better understanding of the present disclosure to those of ordinary skill in the art, several exemplary embodiments of the present disclosure will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

At the very least, each numerical parameter should at least be construed in light of the number of reported significant digits and by applying ordinary rounding techniques. Ranges may be expressed herein as from one endpoint to another endpoint or between two endpoints. All ranges disclosed herein are inclusive of the endpoints, unless specified otherwise.

It should be noted that the technical features in different embodiments described in the following may be replaced, recombined, or mixed with one another to constitute another embodiment without departing from the spirit and the scope of the present disclosure.

The surface-treated copper foil described in the present disclosure includes a bulk copper foil. The bulk copper foil may be formed by electrodeposition (or electrolysis, electrolytic deposition, electroplating), and the bulk copper foil may have a drum side and a deposited side opposite to the drum side.

The surface treatment layer may be disposed on at least one of the drum side and the deposited side of the bulk copper foil. The surface treatment layer may be a single layer structure or a multi-layer stacked structure. For example, according to one embodiment of the present disclosure, a first surface treatment layer may be disposed on one side (such as the deposited side) of the bulk copper foil, and the first surface treatment layer includes a roughening layer, or further includes at least one of a barrier layer, an antirust layer and/or a coupling layer. In addition, according to another embodiment of the present disclosure, a second surface treatment layer may be additionally disposed on the other side (such as the drum side) of the bulk copper foil, and the second surface treatment layer includes a barrier layer, an antirust layer and/or a coupling layer.

According to some embodiments of the present disclosure, a surface-treated copper foil is provided, and the surface-treated copper foil may be used to be attached to a board to form a copper-clad laminate. When the surface-treated copper foil is attached to the board, a first surface treatment layer faces the board, and the outermost surface of the first surface treatment layer (namely, a treating surface of the surface-treated copper foil) thereby faces and is attached to the board. Therefore, the surface morphology of the treating surface of the surface-treated copper foil, such as the material volume and the five-point peak height (S5p) of the surface-treated copper foil, affects not only an etch factor (EF) of the surface-treated copper foil during an subsequent etching process for fabricating conductive lines but also peel strength between the surface-treated copper foil and the board. In particular, when the etch factor (EF) value is larger, it means that the undercut phenomenon of the surface-treated copper foil in the etching process is milder. The description of the etch factor will be described in the following paragraphs which disclose the detection results regarding the etch factor.

In some embodiments of the present disclosure, the material volume (Vm) of the treating surface of the surface-treated copper foil is in a range of 0.06 to 1.45 $\mu m^3/\mu m^2$, for example, in a range of 0.066 to 1.445 $\mu m^3/\mu m^2$, or any value therebetween, and the five-point peak height (S5p) of the treating surface is in a range of 0.15 to 2.00 $\mu m$, for example, in a range of 0.15 to 1.98 $\mu m$, or the value therebetween. In particular, the aforementioned material volume (Vm) and the five-point peak height are in accordance with the definition in ISO 25178-2(2012), and the measurement results are shown in FIGS. 1 and 2 as examples.

FIG. 1 is a plot showing the relationship between the surface height of the surface-treated copper foil and the material ratio (mr) of the surface-treated copper foil according to one embodiment of the present disclosure. In particular, the material volume (Vm) 202 is the sum of the peak material volume (Vmp) 202A and the core material volume (Vmc) 202B. Furthermore, the peak material volume (Vmp) 202A may be regarded as the volume occupied by the peaks in the surface profile. Generally, the peak material volume (Vmp) 202A is obtained by calculating the material ratio (mr) in a range of 0% to P1 (10% by default) and integrating the volume of the material enclosed below the curve and above the horizontal cutting line corresponding to P1, in which the Y-axis value of the horizontal cutting line is equal to the Y-axis value of the point on the curve with the corresponding material ratio (mr) of P1. The core material volume (Vmc) 202B may be regarded as the volume occupied by the core portion in the surface profile, which is obtained by calculating the material ratio (mr) in a range of P1 (10% by default) to P2 (80% by default) and integrating the volume of the material enclosed by the curve and the two horizontal cutting lines, in which the Y-axis values of both of the horizontal cutting lines are respectively equal to the Y-axis values of the points on the curve with the corresponding material ratio (mr) of P1 (10% by default) and P2 (80% by default). The material volume (Vm) 202 is calculated by summing up the peak volume (Vmp) 202A and the core volume (Vmc) 202B, that is, integrating the volumes of the material enclosed below the curve and above the horizontal cutting line corresponding to P2. In other words, the material volume (Vm) 202 is the volume surrounded above the horizontal cutting line and below the curve, in which the corresponding material ratio (mr) is in a range from 0% to P2 (80% by default). It should be noted, unless otherwise specified, the material volume (Vm) disclosed herein refers to an integrated value where the material ratio (mr) is in the range of 0% to 80%, that is, the calculated material volume (Vm) as the material ratio (mr) is 80%.

Because the material volume (Vm) is the calculated value when the material ratio (mr) is within a specific interval, the material volume (Vm) may be regarded as the total volume of all peaks of the measuring surface in a unit area. When the value of the material volume (Vm) of the treating surface of the surface-treated copper foil is higher, the peel strength between the corresponding surface-treated copper foil and the board is higher (that is, the better adhesion strength). However, when the value of the material volume (Vm) is too high, the etch factor (EF) of the surface-treated copper foil could be negatively affected.

Figure 2:
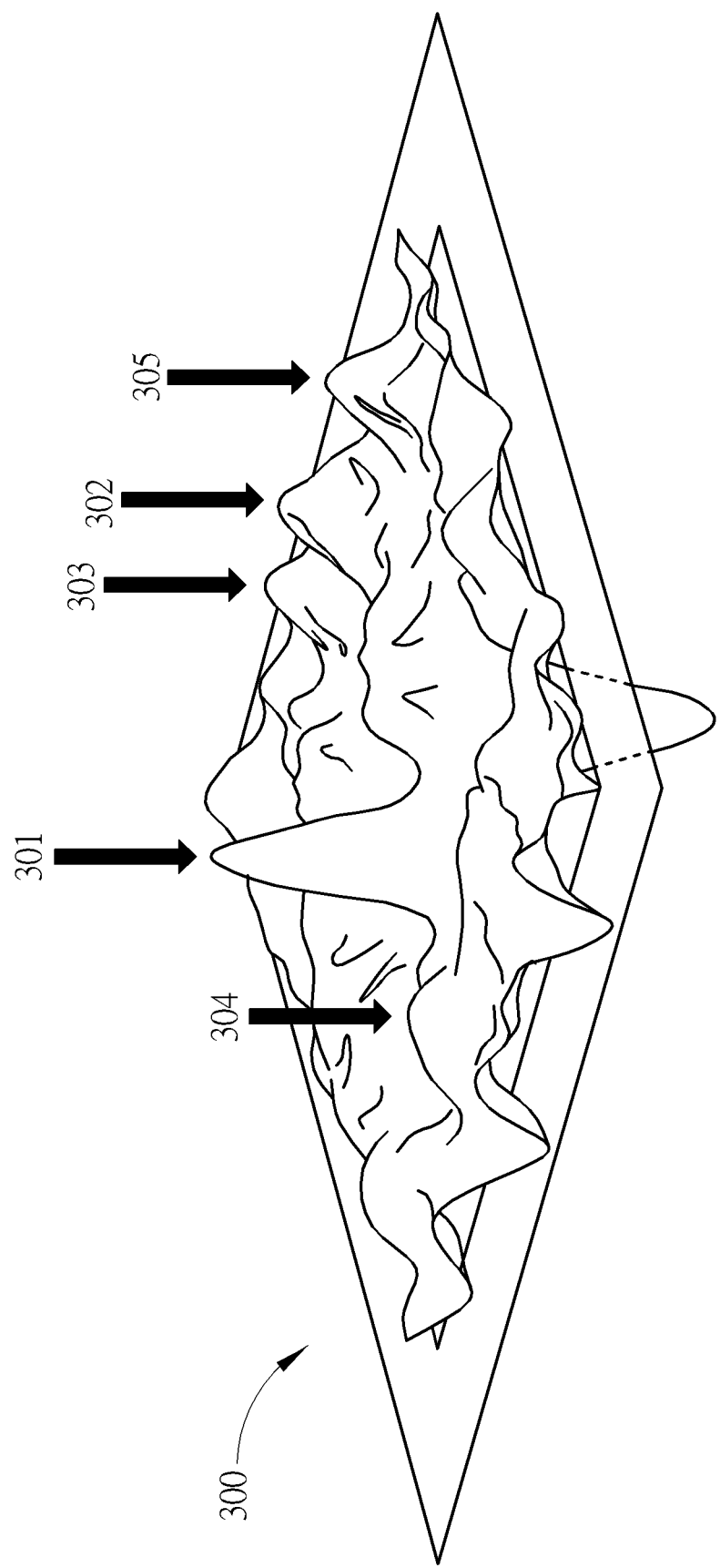
FIG. 2 is a perspective diagram of the partial surface morphology of the surface-treated copper foil according to one embodiment of the present disclosure.

FIG. 2 is a perspective diagram of the partial surface morphology of the surface-treated copper foil according to one embodiment of the present disclosure. Referring to FIG. 2, when the surface of the surface-treated copper foil is measured, a surface morphology 300 in a unit area of the surface-treated copper foil may be shown in FIG. 2 as example. For the plurality of peaks constituting the surface morphology 300, the peaks with the top five heights, such as a first peak 301, a second peak 302, a third peak 303, a fourth peak 304 and a fifth peak 305, are selected to calculate the arithmetic mean of the peak heights of these peaks. The calculated arithmetic mean of the peak heights of these peaks is the five-point peak height (S5p). When the value of the five-point peak height (S5p) of the treating surface of the surface-treated copper foil is higher, the peel strength between the corresponding surface-treated copper foil and the board is higher (that is, the adhesion strength is better). However, when the value of the five-point peak height (S5p) is too high, the etch factor (EF) of the surface-treated copper foil could be negatively affected.

According to some embodiments of the present disclosure, when the material volume (Vm) of the treating surface of the surface-treated copper foil is in a range of 0.06 to 1.45 $\mu m^3/\mu m^2$, and the five-point peak height (S5p) of the treating surface is in a range of 0.15 to 2.00 μm, the surface-treated copper foil may exhibit a better etch factor during the subsequent etching process for fabricating conductive lines, and the peel strength between the surface-treated copper foil and the board may also be larger.

Generally, the treating surface having the roughening layer is pressed to the board, and the opposite surface which is opposite to the treating surface is used to support a photoresist used in an etching process to fabricate the conductive lines. For convenience of explanation, the opposite surface of the surface-treated copper foil, which is opposite to the treating surface of the surface-treated copper foil, will be simply referred to the opposite surface, also known as the resist side. By adjusting the surface morphology of the opposite surface, such as the five-point peak height (S5p), when the dry film photoresist is subsequently attached to the opposite surface of the surface-treated copper foil, the dry film photoresist and the surface-treated copper foil may exhibit better adhesion strength. For example, the five-point peak height (S5p) of the opposite surface may be in a range of 0.55 to 1.50 μm. When the five-point peak height (S5p) of the opposite surface is in a range of 0.55 to 1.50 μm, the dry film photoresist and the opposite surface of the surface-treated copper foil may exhibit better adhesion strength, which is beneficial to the subsequent process of transferring patterns of the dry film photoresist to the surface-treated copper foil. The opposite surface may be a second surface of the bulk copper foil. However, while the second surface treatment layer is provided on the second surface, the opposite surface is the outermost surface of the second surface treatment layer.

Figure 3:
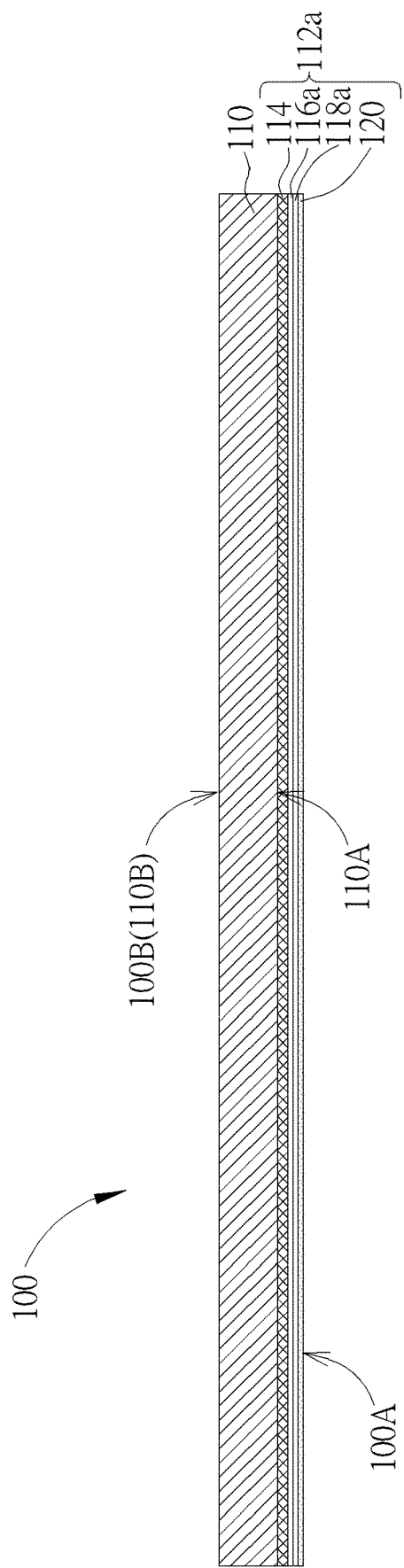
FIG. 3 is a schematic cross-sectional diagram of a surface-treated copper foil according to one embodiment of the present disclosure.

For the aforementioned surface-treated copper foil, the structure thereof is shown in FIG. 3 as example. FIG. 3 is a schematic cross-sectional diagram of a surface-treated copper foil according to one embodiment of the present disclosure. As shown in FIG. 3, a surface-treated copper foil 100 includes at least a treating surface 100A, a bulk copper foil 110 and a first surface treatment layer 112a. The surface-treated copper foil may also include an opposite surface 100B opposite to the treating surface 100A.

In particular, the bulk copper foil 110 is an electrodeposited copper foil, and the thickness thereof is usually larger than or equal to 2 μm, such as in a range of 2 to 250 μm, or in a range of 9 to 210 μm, but is not limited thereto. The bulk copper foil 110 has a first surface 110A and a second surface 110B opposite to the first surfaces 110A. In particular, when the second surface 110B of the bulk copper foil 110 is not provided with any other layer thereon, the second surface 110B is the opposite surface 100B of the surface-treated copper foil 100. According to one embodiment of the present disclosure, when the bulk copper foil 110 is an electrodeposited copper foil, the deposited side of the electrodeposited copper foil may correspond to the first surface 110A of the bulk copper foil 110, and the drum side of the electrodeposited copper foil may correspond to the second surface 110B of the bulk copper foil 110, but not limited thereto.

The surface morphology of the deposited side and drum side of the electrodeposited copper foil may be influenced by an electrodeposition process for forming the electrodeposited copper foil, such as be influenced by a cathode drum for the electrodeposition and additives in electrolytic solution. For example, in order to control the surface morphology of the deposited side of the bulk copper foil 110, during the corresponding electrodeposition process, the surface oxide layer of the cathode drum may be removed (for example, by using a polish buff) to maintain the surface flatness of the cathode drum, and the surface morphology of the deposited side of the bulk copper foil 110 may be thereby controlled. In addition, the surface morphology of both the deposited side and drum side of the bulk copper foil 110 may also be controlled by adjusting the additives in the electrolytic solution. In particular, the additives may be selected from polyoxyethylene sorbitol fatty acid ester, polyoxyethylene fatty acid ester, fatty acid alkanol amide, sucrose fatty acid ester, polysorbate fatty acid ester, alkyl glycoside, 2,3-dimercaptopropanesulfonic acid (DMPS), or a mixture thereof, but it is not limited thereto.

The first surface treatment layer 112a is disposed on the first surface 110A of the bulk copper foil 110, and the outermost surface of the first surface treatment layer 112a may be regarded as the treating surface 100A of the surface-treated copper foil 100, which may contact the board during the subsequent process for laminating the surface-treated copper foil 100 to the board. The first surface treatment layer 112a may be a single layer or a stacked layer including a plurality of sub-layers. When the first surface treatment layer 112a is the stacked layer, each sub-layer may be selected from the group consisting of a roughening layer 114, a first barrier layer 116a, a first antirust layer 118a and a coupling layer 120.

The aforementioned roughening layer 114 includes nodules. The nodules may be used to improve the surface roughness of the bulk copper foil 110, and the nodules may be copper nodules or copper alloy nodules. In order to prevent the nodules from peeling off from the bulk copper foil 110, the roughening layer 114 may further include a covering layer disposed on the nodules to cover the nodules. According to one embodiment of the present disclosure, since the total thickness of the first barrier layer 116a, the first antirust layer 118a and the coupling layer 120 of the first surface treatment layer 112a is much thinner than the thickness of the roughening layer 114, the surface morphology of the treating surface 100A of the surface-treated copper foil 100, such as the material volume (Vm) and the five-point peak height (S5p), is mainly influenced by the roughening layer 114. In addition, the surface roughness of the treating surface 100A of the surface-treated copper foil 100 may be adjusted by adjusting the number and size of nodules in the roughening layer 114. For example, for the nodules and the covering layer formed by an electrodeposition, the morphology and the arrangement of the nodules may be adjusted by adjusting the type or concentration of additives in the electrolytic solution and/or current density during the electrodeposition, but not limited thereto.

The aforementioned barrier layer, such as the first barrier layer 116a, may be such as a metal layer or a metal alloy layer. In particular, the metal layer may be selected from but not limited to nickel, zinc, chromium, cobalt, molybdenum, iron, tin, vanadium, tungsten or titanium, such as nickel layer, nickel-zinc alloy layer, zinc layer, zinc-tin alloy layer or chromium layer. In addition, the metal layer and the metal alloy layer may have a single-layer or multi-layer structure, such as zinc-containing and nickel-containing single layers stacked on each other. In the case of the multi-layer structure, the stacking sequence of the layers may be adjusted according to needs without certain restrictions, for example, the zinc-containing layer is stacked on the nickel-containing layer or the nickel-containing layer is stacked on zinc-containing layer. According to one embodiment of the present disclosure, the first barrier layer 116a is a double-layer structure including a zinc-containing layer and a nickel-containing layer stacked on each other.

The aforementioned antirust layer, such as the first antirust layer 118a, is a coating layer applied to the first barrier layer 116a and is used to protect the first barrier layer 116a and the bulk copper foil 110 from deterioration caused by corrosion or oxidation. The antirust layer includes, but not limited thereto, metal or organic compound. The composition of the first antirust layer 118a is different form the composition of the first barrier layer 116a. When the antirust layer includes metal, the metal may be chromium or chromium alloy, and the chromium alloy may further include one element selected from nickel, zinc, cobalt, molybdenum, iron, tin, vanadium, tungsten, titanium or the combinations thereof. When the antirust layer includes organic compounds, non-limiting examples of organic molecules that may be used to form the organic antirust layer include porphyrin group, benzotriazole, triazine trithiol or the combinations thereof. The porphyrin group includes porphyrin, porphyrin macrocycle, enlarged porphyrin, contracted porphyrin, linear porphyrin polymer, porphyrin sandwich coordination complex, porphyrin array, 5,10,15,20-tetrakis-(4-aminophenyl)-porphyrin-Zn(II) and combinations thereof. According to one embodiment of the present disclosure, the first antirust layer 118a is a chromium-containing layer.

The coupling layer 120 may be made of silane, which are used to improve the adhesion strength between the surface-treated copper foil 100 and other materials (such as a prepreg). The coupling layer 120 may be selected from but not limited to 3-aminopropyltrimethoxysilane, 3-aminopropyltriethoxysilane, N-(2-aminoethyl)-3-aminopropyltrimethoxysilane, (3-glycidoxypropyl)trimethoxysilane, (3-glycidoxypropyl)triethoxysilane, (8-glycidoxoctyl) trimethoxysilane and 3-methacryloxypropyltriethoxysilane. 8-acryloyloxyoctyltriethoxysilane, 3-methacryloxypropyltrimethoxysilane, (3-mercaptopropyl)trimethoxysilane, (3-glycidyloxypropyl)trimethoxysilane, 1-[3-(trimethoxysilyl) propyl] urea, (3-chloropropyl)trimethoxysilane, dimethyldichlorosilane, 3-(trimethoxysilyl)propylmethacrylate, ethyltriacetoxysilane, isobutyltriethoxysilane, n-octyltriethoxysilane, tris(2-methoxyethoxy)vinylsilane, trimethylchlorosilane, methyltrichlorosilane, tetrachlorosilane, tetraethoxysilane, phenyltrimethoxysilane, chlorotriethoxysilane, ethylene-trimethoxysilane, alkoxysilane having 1 to 20 carbon atoms, vinylalkoxysilane having 1 to 20 carbon atoms, (methyl)acylsilane or the combinations thereof, but are not limited thereto.

Figure 4:
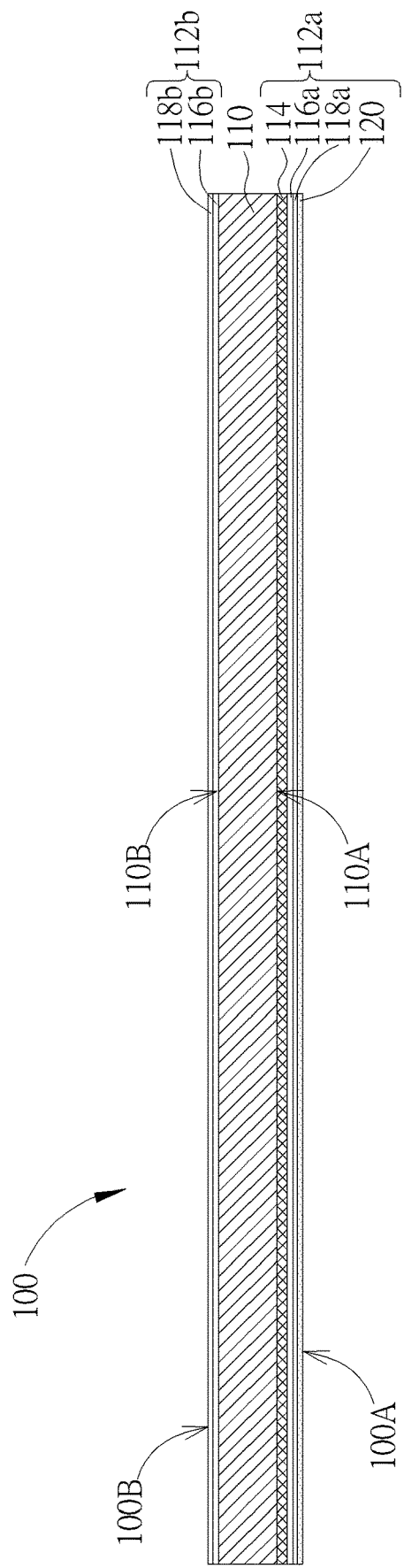
FIG. 4 is a schematic cross-sectional diagram of a surface-treated copper foil according to another embodiment of the present disclosure.

The structure of the surface-treated copper foil is not limited to that shown in FIG. 3, but it may be other structures, such as that shown in FIG. 4. FIG. 4 is a schematic cross-sectional diagram of a surface-treated copper foil according to another embodiment of the present disclosure. As shown in FIG. 4, the structure and composition of the surface-treated copper foil 100 are similar to those shown in FIG. 3. The main difference is that the surface-treated copper foil 100 shown in FIG. 4 includes not only the first surface treatment layer 112a disposed on the first surface 110A of the bulk copper foil 110 but also another surface treatment layer, such as a second surface-treated layer 112b, disposed on the second surface 110B of the bulk copper foil 110. When the surface-treated copper foil 100 includes the second surface treatment layer 112b, the outermost surface of the second surface treatment layer 112b may be regarded as the opposite surface 100B of the surface-treated copper foil 100. The second surface treatment layer 112b may be a single layer or a stacked layer including a plurality of sub-layers. For example, the second surface treatment layer 112b may include a second barrier layer 116b and a second antirust layer 118b sequentially arranged on the second surface 110B, and the outermost surface of the second antirust layer 118b is the outermost surface of the second surface treatment layer 112b.

The composition of the second barrier layer 116b is different from that of the second antirust layer 118b, and the compositions of the second barrier layer 116b and the second antirust layer 118b may be respectively selected from the same group as the first barrier layer 116a and the first antirust layer 118a, but the compositions of the second barrier layer 116b and the second antirust layer 118b are not limited to be the same as those of the first barrier layer 116a and the first antirust layer 118a respectively. Therefore, the compositions of the second barrier layer 116b and the first barrier layer 116a may be the same or different from each other, and the compositions of the second antirust layer 118b and the first antirust layer 118a may be the same or different from each other. According to one embodiment of the present disclosure, the second barrier layer 116b is a zinc-containing single-layer structure, and the second antirust layer 118b is a chromium-containing layer.

The aforementioned surface-treated copper foil 100 may be further processed to fabricate a copper-clad laminate (CCL). The copper-clad laminate includes at least the board and the surface-treated copper foil. The surface-treated copper foil is disposed on at least one surface of the board, and the surface-treated copper foil includes a treating surface. In particular, the treating surface of the surface-treated copper foil may be in direct contact with and facing the board.

The board may be made of bakelite board, polymer board or fiberglass board, but is not limited thereto. The polymer components of the polymer board may be such as epoxy resins, phenolic resins, polyester resins, polyimide resins, acrylics, formaldehyde resins, bismaleimidetriazine resins (also known as BT resin), cyanate ester resin, fluorinated fluoropolymers, poly ether sulfone, cellulosic thermoplastics, polycarbonate, polyolefins, polypropylene, polysulfide, polyurethane, polyimide, liquid crystal polymer (LCP), and polyphenyleneoxide (PPO). The aforementioned glass fiber board may be a prepreg formed by soaking glass fiber nonwoven fabric in the aforementioned polymer (e.g., epoxy resin).

The aforementioned copper-clad laminate may be further fabricated into a printed circuit board, and the steps may include patterning the surface-treated copper foil to obtain conductive lines, and bonding the two adjacent boards to each other.

Methods for fabricating a surface-treated copper foil and a copper-clad laminate are further described as examples. Each step in the fabricating method is described as follows:

(1) Step A

Step A is performed to provide a bulk copper foil. An electrodeposition apparatus may be used to form electrodeposited copper foil (or referred to as a bare copper foil) by an electrodeposition process. Specifically, the electrodeposition apparatus may include at least a drum as a cathode, pairs of insoluble metal anode plates, and an inlet manifold for electrolyte solution. In particular, the drum is a rotatable metal drum, the surface thereof is a mirror polished surface. The metal anode plates may be separated from and fixedly disposed at the lower half of the drum to surround the lower half of the drum. The inlet manifold may be fixedly disposed under the drum and between two metal anode plates.

Copper sulfate solution may be used as electrolyte solution in the electrodeposition process, and the copper sulfate solution may be prepared by dissolving copper wires in 50 wt. % sulfuric acid aqueous solution. In addition, the electrolyte solution may also include additives, such as surfactants and metal chelating agents. During the electrodeposition process, the inlet manifold continuously supplies electrolyte solution between the drum and the metal anode plates. By applying current or voltage between the drum and the metal anode plates, copper may be electrodeposited on the drum to form a bulk copper foil. In addition, the continuous bulk copper foil may be manufactured by continuously rotating the drum and peeling the bulk copper foil from one side of the drum. The surface of the bulk copper foil facing the drum may be referred to as a drum side, while the surface of the electrodeposited copper foil away from the drum may be referred to as a deposited side. In addition, during the electrodeposition process, the surface of the cathode drum may be slightly oxidized, resulting in a rugged surface, thereby reducing the flatness of the drum side of the bulk copper foil. Therefore, a polish buff may be further disposed adjacent to the cathode drum to form a contact surface between the cathode drum and the polish buff. By rotating the polish buff at a predetermined rotational speed and in the same or opposite direction to the direction of the angular velocity of the cathode drum, the oxide layer on the surface of the cathode drum may be removed by the polish buff, thus maintaining the surface flatness of the cathode drum. The angular velocity is a vector, and the direction thereof is determined by the right-hand rule.

For the bulk copper foil, the fabrication parameters are described as follows:
<1.1 Composition of Electrolyte Solution and Electrolysis Conditions for Bare Copper Foil>
Copper sulfate ($CuSO_4 \cdot 5H_2O$): 320 g/L
Sulfuric acid: 95 g/L
Chloride ion (from hydrochloric acid, manufactured by RCl Labscan Ltd.): 30 mg/L (ppm)
Liquid temperature: 52° C.
Current density: 50 A/dm$^2$
Thickness of bulk copper foil: 18 μm
Concentration of polyoxyethylene sorbitol fatty acid ester: 6.5-12.5 ppm
Concentration of 2,3-dimercaptopropanesulfonic acid (DMPS): 4-8 ppm
<1.2 Cathode Drum>
Rotational speed: 1.0 m/min
<1.3 Polish Buff>
Type (Nippon Tokushu Kento Co., Ltd): #2000
Rotational speed: 300-600 rpm
Angular velocity direction of polish buff (compared with angular velocity direction of cathode drum): both in same direction or opposite direction.
(2) Step B
In step B, a surface cleaning process is performed on the bulk copper foil to ensure that the surface of the bulk copper foil is free of contaminant (such as oil stains and oxides), the fabrication parameters are described as follows:
<2.1 Composition and Cleaning Conditions of Cleaning Solution>
Copper sulfate ($CuSO_4 \cdot 5H_2O$): 130 g/L
Sulfuric acid: 50 g/L
Liquid temperature: 27° C.
Soaking time: 30 seconds (3) Step C
In step C, a roughening layer is formed on the deposited side of the aforementioned bulk copper foil. For example, the nodules may be formed on the deposited side of the bulk copper foil by an electrodeposition process. In addition, in order to prevent the nodules from falling, a covering layer may be further formed on the nodules. The fabrication parameters of the roughening layer (including the nodules and the covering layer) are described as follows:
<3.1 Parameters for Fabricating Nodules>
Copper sulfate ($CuSO_4 \cdot 5H_2O$): 70 g/L
Sulfuric acid: 100 g/L
Liquid temperature: 25° C.
Current density: 34 A/dm$^2$
Processing time: 10 seconds
<3.2 Parameters for Fabricating Covering Layer>
Copper sulfate ($CuSO_4 \cdot 5H_2O$): 320 g/L
Sulfuric acid: 100 g/L
Liquid temperature: 40° C.
Current density: 9 A/dm$^2$
Processing time: 10 seconds
(4) Step D
In step D, a barrier layer is formed on each side of the bulk copper foil, for example, by an electrodeposition process, so as to form a barrier layer with a double-layer stacked structure (e.g., nickel-containing layer/zinc-containing layer, but not limited thereto) on the side of the bulk copper foil having the roughening layer, while to form a barrier layer with a single-layer structure (e.g., zinc-containing layer, but not limited thereto) on the side of the bulk copper foil without the roughening layer. The fabrication parameters thereof are described as follows:
<4.1 Electrolyte Composition and Electrodeposition Conditions for Forming Nickel-Containing Layer>
Nickel sulfate ($NiSO_4 \cdot 7H_2O$): 180 g/L
Boric acid ($H_3BO_3$): 30 g/L
Sodium hypophosphite ($NaH_2PO_2$): 3.6 g/L
Liquid temperature: 20° C.
Current density: 0.4 A/dm$^2$
Processing time: 3 seconds
<4.2 Electrolyte Composition and Electrodeposition Conditions for Forming Zinc-Containing Layer>
Zinc sulfate ($ZnSO_4 \cdot 7H_2O$): 9 g/L
Ammonium vanadate (($NH_4)_3VO_4$): 0.3 g/L
Liquid temperature: 20° C.
Current density: 0.4 A/dm$^2$
Processing time: 3 seconds
(5) Step E
In step E, an antirust layer, such as a chromium-containing layer, is formed on the barrier layer on each side of the aforementioned bulk copper foil, and the fabrication parameters are described as follows:
<5.1 Electrolyte Composition and Electrodeposition Conditions for Forming Chromium-Containing Layer>
Chromium trioxide ($CrO_3$): 5 g/L
Liquid temperature: 30° C.
Current density: 1 A/dm$^2$
Processing time: 3 seconds
(6) Step F
In step F, a coupling layer is formed on the side of the bulk copper foil having the roughening layer, the barrier layer and the antirust layer thereon. For example, after the completion of the aforementioned electrodeposition process, the bulk copper foil is cleaned by water, and the surface of the bulk copper foil is not subject to a drying process. Afterwards, an aqueous solution containing silane coupling agent is sprayed on the antirust layer on the side of the bulk copper foil having the roughening layer, so that the silane coupling agent is adsorbed on the surface of the antirust layer. Subsequently, the bulk copper foil may be dried in an oven. The fabrication parameters are described as follows:

<6.1 Parameters for Fabricating a Silane Coupling Agent>

Silane coupling agent: 3-aminopropyl triethoxysilane (S-330)

Concentration of the silane coupling agent in aqueous solution: 0.25 wt. %

Spraying time: 3 seconds

In order to enable a person having ordinary skill in the art to implement the present disclosure, the specific examples regarding a copper foil and a copper-clad laminate are further elaborated below. It should be noted, however, that the following examples are for illustrative purposes only and should not be construed to limit the present disclosure. That is, the materials, the amounts and ratios of the materials, and the processing flow in the respective examples may be appropriately modified so long as these modifications are within the scope of the present disclosure as defined by the appended claims.

EXAMPLES

Examples 1-8

Examples 1-8 are surface-treated copper foils, and the fabricating process includes steps A to F in the aforementioned fabricating processes. The fabrication parameters that differ from those of the aforementioned fabricating process are shown in TABLE 1. Specifically, the structures of the surface-treated copper foils of Examples 1-8 are shown in FIG. 4, in which the roughening layer is disposed on the deposited side, a nickel-containing layer, a zinc-containing layer, a chromium-containing layer and a coupling layer are sequentially formed on the roughening layer, and the outermost surface of the coupling layer is the treating surface of the surface-treated copper foil. A zinc-containing layer and a chromium-containing layer are sequentially formed on the side of the bulk copper foil without the roughening layer, and the outermost surface of the chromium-containing layer is the opposite surface of the surface-treated copper foil. The thickness of surface-treated copper foil is 18 μm.

Comparative Examples 1-8

The fabricating processes of Comparative Examples 1-8 correspond to steps A to F in the aforementioned fabricating process. The fabricating parameters that differ from those of the aforementioned fabricating process are shown in TABLE 1. Specifically, the structures of the surface-treated copper foils of Comparative Examples 1-8 are shown in FIG. 4, in which the roughening layer is disposed on the deposited side, a nickel-containing layer, a zinc-containing layer, a chromium-containing layer and a coupling layer are sequentially formed on the roughening layer, and the outermost surface of the coupling layer is the treating surface of the surface-treated copper foil. A zinc-containing layer and a chromium-containing layer are sequentially formed on the side of the bulk copper foil without the roughening layer, and the outermost surface of the chromium-containing layer is the opposite surface of the surface-treated copper foil.

TABLE 1

| | Additives of electrolyte solution for bare copper foil | | Polish buff | |
|---|---|---|---|---|
| | Polyoxyethylene sorbitol fatty acid ester (ppm) | DMPS (ppm) | Rotational speed (rpm) | Direction of angular velocity (compared with cathode drum) |
| Ex. 1 | 6.5 | 4 | 300 | Opposite |
| Ex. 2 | 12.5 | 4 | 300 | Opposite |
| Ex. 3 | 6.5 | 8 | 300 | Opposite |
| Ex. 4 | 6.5 | 4 | 600 | Opposite |
| Ex. 5 | 12.5 | 8 | 600 | Same |
| Ex. 6 | 6.5 | 4 | 300 | Same |
| Ex. 7 | 6.5 | 8 | 300 | Same |
| Ex. 8 | 12.5 | 4 | 600 | Same |
| c.f. 1 | 15 | 4 | 300 | Opposite |
| c.f. 2 | 4 | 4 | 300 | Opposite |
| c.f. 3 | 6.5 | 10 | 300 | Opposite |
| c.f. 4 | 6.5 | 2 | 300 | Opposite |
| c.f. 5 | 6.5 | 4 | 800 | Opposite |
| c.f. 6 | 6.5 | 4 | 100 | Opposite |
| c.f. 7 | 12.5 | 4 | 600 | Opposite |
| c.f. 8 | 12.5 | 8 | 600 | Opposite |

The test results of the aforementioned Examples 1-8 and Comparative Examples 1-8, such as <Material volume (Vm)>, <Five-point peak height (S5p)>, <Etch factor (EF)>, <Peel strength)>, <Adhesion strength of dry film photoresist>, are further elaborated below. The test results are shown in TABLE 2.

<Material Volume (Vm)> and <Five-Point Peak Height (S5p)>

Material volume (Vm) and five-point peak height (S5p) of the treating surface of the surface-treated copper foil are defined in accordance with ISO 25178-2: 2012 and are acquired by using surface texture analysis of a laser microscope (LEXT OLS5000-SAF, manufactured by Olympus). Specific measurement conditions are as follows:

Wavelength of light source: 405 nm

Objective lens magnification: 100× objective lens (MPLAPON-100× LEXT, manufactured by Olympus)

Optical zoom: 1.0×

Image area: 129 μm×129 μm

Resolution: 1024 pixels×1024 pixels

Mode: the Auto tilt removal

Filter: S-filter=2.5 μm

In particular, the material volume is obtained as the material ratio (mr) is set at 80%, and the value is equal to the sum of the core material volume (Vmc) and the peak material volume (Vmp). The test results are shown in TABLE 2.

<Etch Factor (EF)>

The surface-treated copper foil and a board, such a resin board, are laminated in a way that the treating surface of the surface-treated copper foil faces the board. Then, the opposite surface of the surface-treated copper foil (that is, the surface opposite to the treating surface) is laminated with a dry film photoresist layer to form a laminated board. Then, an exposure mask (L/S=1/1, linear pattern layout, each line width is 30 μm) is used to cover the surface of the laminated board. Under the cover of the exposure mask, the laminated board was exposed for 15 minutes by using the exposure machine to cure a portion of the dry film photoresist layer.

Subsequently, a developing process is performed, and a developer is sprayed on the dry film photoresist layer to remove the uncured portion of the dry film photoresist layer, thereby forming a patterned photoresist layer having a linear pattern.

Figure 5:
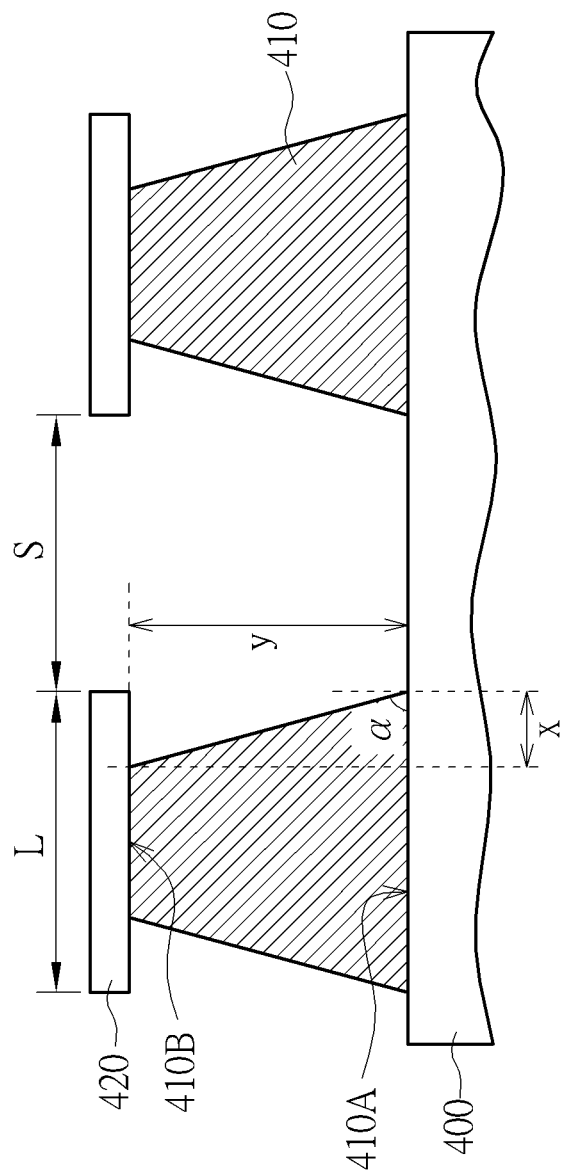
FIG. 5 is a schematic cross-sectional diagram of a surface-treated copper foil having patterns of conductive lines according to one embodiment of the present disclosure.

Then, an aqueous solution of copper chloride ($CuCl_2$) with a specific gravity of 1.3 and an aqueous solution of hydrochloric acid with a concentration of 2.5M are mixed with each other at a volume ratio of 1:1 to prepare an etching solution, which was used to etch the aforementioned sample to transfer the pattern defined by the patterned photoresist layer to the surface-treated copper foil, thereby obtaining the patterned surface-treated copper foil as shown in FIG. 5.

As shown in FIG. 5, a patterned surface-treated copper foil 410 (or so-called conductive line pattern) may be disposed on a board 400, and the top surface of the patterned surface-treated copper foil 410 is covered by a patterned photoresist layer 420. The line width and the line space of the patterned surface-treated copper foil 410 may be determined by the patterned photoresist layer 420 having a predetermined line width L and a predetermined line space S above. However, during the process of transferring the pattern formed by the patterned photoresist layer 420 to the surface-treated copper foil, since the etching solution may laterally etch the surface-treated copper foil, a bottom angle α of the patterned surface-treated copper foil 410 may be thereby less than 90 degrees, and a width difference x exists between a width of a bottom surface 410A (corresponding to the treating surface of the surface-treated copper foil) and a width of a top surface 410B (corresponding to the opposite surface of the surface-treated copper foil) of the patterned surface-treated copper foil 410. An optical microscope may be used to obtain a thickness y and the width difference x of the patterned surface-treated copper foil 410, and the etch factor (EF) is obtained by dividing the thickness y of the patterned surface-treated copper foil 410 by the width difference x of the patterned surface-treated copper foil 410. When the value of the etch factor (EF) is larger, it means that the lateral etching phenomenon is less likely to occur for the surface-treated copper foil, and the possibility of generating broken fine conductive lines is low, and thus the pattern formed by the patterned photoresist layer can be completely transferred to the underlying surface-treated copper foil. The test results regarding the etch factor are shown in TABLE 2.

<Peel Strength>

The surface-treated copper foil and a commercially available resin sheet (Megtron 6, Panasonic Co.), having a thickness of 0.09 mm, are laminated in a way that the treating surface of the surface-treated copper foil faces the commercially available resin sheet to form a laminated board. Then, the laminated board is cut into a sample size with 125 mm(L)×10 mm(W). The corresponding parameters and the pressing conditions are as follows, and the measurement results are shown in TABLE 2:

Sample size: 125 mm(L)×10 mm(W)
Resin sheet: Megatron 6, Panasonic
Pressing temperature: 190° C.
Pressure: 427 psi
Pressing time: 120 minutes Afterwards, a universal testing machine was used to peel the surface-treated copper foil from the copper-clad laminate at an angle of 90° in accordance with the standard JIS C 6471. The peeling conditions are as follows:

Peeling instrument: universal testing machine, Shimadzu AG-I
Peeling angle: 90°

<Adhesion Strength of Dry Film Photoresist>

The surface-treated copper foil and the resin sheet (Megtron 6, Panasonic Co.) are laminated in a way that the treating surface of the surface-treated copper foil faces the resin sheet. Then, the opposite surface of the surface-treated copper foil (that is, the surface opposite to the treating surface) and the dry film photoresist layer (FF-9030A, Chang Chun plastics. co.) are laminated to form a laminated board. In particular, the pressing conditions for laminating the dry film photoresist layer are: temperature: 65° C., pressure: 3.0 kg/cm², and pressing time: 3 seconds.

After the dry film photoresist and the surface-treated copper foil are laminated, the obtained laminated board is cooled at room temperature for 15 minutes. Then, an exposure mask (L/S=1/1, linear pattern layout, each line width is in a range of 20 to 50 μm) is used to cover the surface of the laminated board. Under the cover of the exposure mask, the laminated board is exposed for 15 minutes by an exposure machine (EXM-1201F, ORC) at an energy intensity of 30 mJ/cm² to cure a portion of the dry film photoresist layer.

After the exposure process, the laminated board is cooled at room temperature for 15 minutes. Subsequently, a wet developing process is performed during which developer is sprayed on the dry film photoresist layer to remove the uncured dry film photoresist layer to form a patterned photoresist layer with linear patterns. In particular, the developing conditions are: temperature: 29° C., Concentration of developer: 1.0 wt. % $Na_2CO_3$, and the spraying pressure: 1.2 kg/cm².

Then, 36 wt % hydrochloric acid aqueous solution, 40 wt % ferric chloride aqueous solution and ultrapure water are mixed in a volume ratio of 1:1:1 to prepare an etching solution. Subsequently, the etching solution is used to etch the surface-treated copper foil, so as to transfer the pattern formed by the patterned photoresist layer to the surface-treated copper foil, and thereby obtain the patterned surface-treated copper foil.

The surface-treated copper foils with various patterns may be formed by using various exposure masks. For example, through the aforementioned process, several groups of samples with line widths equivalently increasing by 5 μm may be prepared, such as the first group with 20 μm line width, the second group with 25 μm line width and the third group with 30 μm line width, and each group includes 5 samples.

When the patterned electrodeposited copper layer is obtained, the samples are observed to determine whether the patterned photoresist layer peels off from the surface of the patterned surface-treated copper foil in each group of samples, so as to evaluate the adhesion strength between the photoresist layer and the surface-treated copper foil. The evaluation criteria are as follows, and the measurement results are shown in TABLE 2:

Class A: For a specific group with line width≤30 μm, the patterned photoresist layer of all the five samples of the group is not peeled off from the surface of the patterned surface treated copper foil.

Class B: For a specific group with line width≤30 μm, portions of the patterned photoresist layer of the five samples of the group are peeled off from the surface of the patterned surface treated copper foil. However, for a specific group with line width>30 μm, the patterned photoresist layer of all the five samples of the group is not peeled off from the surface of the patterned surface treated copper foil.

| | Treating surface of surface-treated copper foil | | Opposite surface of surface-treated copper foil | | Peel strength (N/mm) | Adhesion strength of dry film photoresist |
|---|---|---|---|---|---|---|
| | Vm ($\mu m^3/\mu m^2$) | S5p ($\mu m$) | S5p ($\mu m$) | Etch factor | | |
| Ex. 1 | 0.415 | 1.63 | 1.14 | 3.7 | 0.62 | A |
| Ex. 2 | 1.137 | 1.51 | 1.16 | 2.8 | 0.65 | A |
| Ex. 3 | 0.126 | 1.45 | 1.25 | 3.8 | 0.60 | A |
| Ex. 4 | 0.829 | 1.36 | 0.57 | 3.6 | 0.61 | A |
| Ex. 5 | 1.214 | 0.15 | 0.89 | 4.5 | 0.56 | A |
| Ex. 6 | 0.131 | 1.98 | 1.48 | 3.1 | 0.64 | A |
| Ex. 7 | 0.066 | 1.70 | 1.46 | 3.6 | 0.63 | A |
| Ex. 8 | 1.443 | 0.87 | 0.82 | 3.9 | 0.60 | A |
| c.f. 1 | 1.750 | 1.04 | 1.17 | 2.4 | 0.68 | A |
| c.f. 2 | 0.207 | 2.16 | 1.15 | 2.4 | 0.67 | A |
| c.f. 3 | 0.053 | 1.01 | 1.14 | 4.9 | 0.49 | A |
| c.f. 4 | 0.886 | 2.22 | 1.16 | 2.5 | 0.66 | A |
| c.f. 5 | 1.603 | 1.09 | 0.28 | 2.6 | 0.67 | B |
| c.f. 6 | 0.111 | 2.15 | 1.76 | 2.6 | 0.68 | B |
| c.f. 7 | 1.669 | 0.74 | 0.56 | 2.5 | 0.69 | A |
| c.f. 8 | 1.343 | 0.11 | 0.58 | 4.3 | 0.53 | A |

For the Examples 1-8 according to TABLE 2, when the material volume (Vm) of the treating surface of the surface-treated copper foil is in a range of 0.06 to 1.45 $\mu m^3/\mu m^2$, and when the five-point peak height (S5p) of the treating surface is in a range of 0.15 to 2.00 µm, the etch factor of the surface-treated copper foil is greater than 2.8, and the peel strength is thereby greater than 0.55 N/mm. In contrast, for the Comparative Examples 1-8, when one of the material volume (Vm) and the five-point peak height (S5p) of the treating surface of the surface-treated copper foil does not fall within the above range, the etch factor of the surface-treated copper foil is smaller than 2.8 or the peel strength is smaller than 0.55 N/mm.

For Examples 1-8, the corresponding surface-treated copper foils exhibit larger etch factors and larger peel strengths. Besides, since the five-point peak height (S5p) of the opposite surface of the surface-treated copper foil of each of Examples 1-8 is in a range of 0.55 to 1.50 µm, the adhesion strength between the opposite surface of the surface-treated copper foil and the dry film photoresist can further fall in Class A. In contrast, for Comparative Examples 1-8, when the five-point peak height (S5p) of the opposite surface of the surface-treated copper foil does not fall within the above range, the adhesion strength between the surface-treated copper foil and the dry film photoresist will fall in Class B.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A surface-treated copper foil, comprising:
    a bulk copper foil, comprising a first surface; and
    a first surface treatment layer, disposed on the first surface and comprising a roughening layer, wherein an outermost surface of the first surface treatment layer is a treating surface of the surface-treated copper foil, the material volume (Vm) of the treating surface is in a range of 0.06 to 1.45 $\mu m^3/\mu m^2$, and the five-point peak height (S5p) of the treating surface is in a range of 0.15 to 2.00 µm.

2. The surface-treated copper foil of claim 1, further comprising:
    a counter surface located opposite to the treating surface, wherein the counter surface is an outermost surface of the surface-treated copper foil, and the five-point peak height (S5p) of the counter surface is in a range of 0.55 to 1.50 µm.

3. The surface-treated copper foil of claim 1, wherein the first surface treatment layer further comprises at least one of a barrier layer, an antirust layer and a coupling layer.

4. The surface-treated copper foil of claim 1, further comprising:
    a second surface treatment layer, disposed on a second surface of the bulk copper foil opposite to the first surface, and the second surface treatment layer comprises at least one of a barrier layer and an antirust layer.

5. The surface-treated copper foil of claim 4, wherein the five-point peak height (S5p) of an outermost surface of the second surface treatment layer is in a range of 0.55 to 1.50 µm.

6. The surface-treated copper foil of claim 5, wherein an outermost surface of the antirust layer is the outermost layer of the second surface treatment layer.

7. The surface-treated copper foil of claim 4, wherein a composition of the barrier layer comprises nickel, zinc, chromium, cobalt, molybdenum, iron, tin, vanadium, tungsten or titanium, and a composition of the antirust layer comprises nickel, zinc, chromium, cobalt, molybdenum, iron, tin, vanadium, tungsten, titanium, porphyrin group, benzotriazole, trithiol or the combination thereof, wherein porphyrin group comprises porphyrin, porphyrinic macrocycle, expanded porphyrin, contracted porphyrin, linear porphyrin polymer, porphyrin sandwich complex, coordination or porphyrin array, 5,10,15,20-tetrakis(4-aminophenyl)-porphyrin-zinc (II), and the composition of the barrier layer is different from the composition of the antirust layer.

8. A copper-clad laminate, comprising:
    a board; and
    the surface-treated copper foil of claim 1, wherein the treating surface is attached to the board.

9. The copper-clad laminate of claim 8, wherein the treating surface is in direct contact with the board.

* * * * *